(12) United States Patent
Schwab

(10) Patent No.: US 9,379,349 B2
(45) Date of Patent: Jun. 28, 2016

(54) OLED DEVICE WITH SPATIALLY ISOLATED LIGHT-EMITTING AREAS

(75) Inventor: Holger Schwab, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/634,606

(22) PCT Filed: Mar. 14, 2011

(86) PCT No.: PCT/IB2011/051053
§ 371 (c)(1),
(2), (4) Date: Sep. 13, 2012

(87) PCT Pub. No.: WO2011/117771
PCT Pub. Date: Sep. 29, 2011

(65) Prior Publication Data
US 2013/0001595 A1     Jan. 3, 2013

(30) Foreign Application Priority Data

Mar. 22, 2010  (EP) .................................... 10157180

(51) Int. Cl.
*H01L 27/15* (2006.01)
*H01L 51/52* (2006.01)
(Continued)

(52) U.S. Cl.
CPC ........ *H01L 51/5203* (2013.01); *H01L 27/3239* (2013.01); *H01L 51/0022* (2013.01); *H01L 51/5234* (2013.01)

(58) Field of Classification Search
CPC ............ H01L 51/5234; H01L 51/5203; H01L 51/0022; H01L 27/3239
USPC ............................... 438/25; 257/79, E51.018
See application file for complete search history.

(56) References Cited

U.S. PATENT DOCUMENTS 4,885,448 A * 12/1989 Kasner et al. ............ 219/121.69
5,131,877 A    7/1992 Mathumoto
(Continued)

FOREIGN PATENT DOCUMENTS

FR      2932598 A1   12/2009
JP       794285 A     4/1995
(Continued)

OTHER PUBLICATIONS

Machine Translation of FR2932598, which was part of Applicant's IDS.*

*Primary Examiner* — Kimberly Rizkallah
*Assistant Examiner* — Alexander Belousov

(57) ABSTRACT

The invention describes a method of forming spatially isolated light-emitting areas ($R_1$, $R_2$, $R_3$) on a common substrate (11) of an OLED device (1) comprising a plurality of device layers (12, 15, 16), which device layers (12, 15, 16) comprise an active layer (15) enclosed between a first electrode (12) and a second electrode (16), which method comprises the steps of applying an insulating bridge (20) between a contact pad (13) and the isolated region ($R_1$, $R_2$, $R_3$) of the second electrode (16); and subsequently applying a conductor (30) from a contact pad (13) to the isolated region ($R_1$, $R_2$, $R_3$) of the second electrode (16) to form an electrical connection between the contact pad (13) and the isolated region ($R_1$, $R_2$, $R_3$). The invention further describes an OLED device (1) comprising a number of spatially isolated light-emitting areas ($R_1$, $R_2$, $R_3$) on a common substrate (11), wherein a plurality of device layers (12, 15, 16) of the OLED device initially comprises an active layer (15) enclosed between a first electrode (12) and a second electrode (16), and wherein the OLED device (1) comprises at least one spatially and electrically isolated region ($R_1$, $R_2$, $R_3$) of the second electrode (16); an insulating bridge (20) applied between a contact pad (13) and the isolated region ($R_1$, $R_2$, $R_3$) of the second electrode (16); and a conductor (30) applied onto the insulating bridge (20) for electrically connecting the contact pad (13) and the isolated region ($R_1$, $R_2$, $R_3$) of the second electrode (16).

15 Claims, 4 Drawing Sheets

(51) Int. Cl.
*H01L 27/32* (2006.01)
*H01L 51/00* (2006.01)

(56) References Cited

U.S. PATENT DOCUMENTS

| | | | | |
|---|---|---|---|---|
| 6,897,855 | B1 * | 5/2005 | Matthies et al. | 345/204 |
| 7,156,942 | B2 | 1/2007 | McCormick et al. | |
| 7,214,967 | B2 | 5/2007 | Park et al. | |
| 7,271,534 | B2 | 9/2007 | Padiyath et al. | |
| 2003/0220043 | A1 * | 11/2003 | Kao | 445/24 |
| 2004/0119403 | A1 * | 6/2004 | McCormick et al. | 313/506 |
| 2004/0164667 | A1 | 8/2004 | Dedene et al. | |
| 2005/0236975 | A1 | 10/2005 | Addington et al. | |
| 2006/0062899 | A1 * | 3/2006 | Rankin et al. | 427/58 |
| 2006/0108918 | A1 | 5/2006 | Cok et al. | |
| 2008/0094004 | A1 * | 4/2008 | Ackermann | 315/294 |
| 2008/0169750 | A1 | 7/2008 | Kim et al. | |
| 2008/0218068 | A1 * | 9/2008 | Cok | 313/505 |
| 2009/0015156 | A1 | 1/2009 | Budde et al. | |

FOREIGN PATENT DOCUMENTS

| | | | | |
|---|---|---|---|---|
| JP | 8273829 | A | 10/1996 | |
| JP | 11317293 | A | 11/1999 | |
| JP | 2001143868 | * | 5/2001 | H05B 33/12 |
| JP | 20063698 | A | 1/2006 | |
| WO | 2004061992 | A1 | 7/2004 | |
| WO | 2005022662 | A1 | 3/2005 | |
| WO | 2009115955 | A1 | 9/2009 | |

* cited by examiner

OLED DEVICE WITH SPATIALLY ISOLATED LIGHT-EMITTING AREAS

FIELD OF THE INVENTION

The invention describes a method of manufacturing an OLED device with spatially isolated light-emitting areas. The invention further describes such an OLED device.

BACKGROUND OF THE INVENTION

OLEDs are becoming widely used in display and illumination devices. An OLED device is usually constructed on a transparent glass or plastic substrate, onto which a first electrode layer is deposited. This first electrode, which is usually the anode, is often applied using a sputtering process. The first electrode is usually transparent and can be made of a material such as aluminium doped zinc oxide (ZnO), tin-doped indium oxide (ITO) or a highly ductile transparent conductive polymer such as Poly(3,4-ethylene-dioxythiophene) poly(styrenesulfonate) PEDOT:PSS, etc. Additional metal areas can be applied along the edges of the device, which metal areas will later be used as contact pads for the anode and the cathode. Once the first electrode layer has been applied, one or more layers of organic semiconductor materials, chosen for their light-emitting properties, are applied to give an active light-emitting layer. On top of this, a second electrode layer, usually the cathode, is applied such that an electrical contact is made between the second electrode and a contact pads on the edge of the OLED device. In a final step, the device is hermetically sealed to protect the device layers from moisture, and the anode and cathode are accessed only by the contact pads usually located on the outside edges of the device.

If it is desired that the OLED device should only emit light within certain areas instead of over the entire surface of the device, a shadow mask can be used to apply the second electrode. The shadow mask will have openings corresponding to the areas that are to emit light. However, using the established manufacturing techniques, only certain geometrical shapes can be realised for the light-emitting areas since each cathode area must be electrically connected to a contact pad or 'patch' outside the OLED encapsulation. This means that only very limited geometrical shapes can effectively be realised for the light emitting areas. To obtain other shapes, separate OLED elements, each of which has a second electrode realised to with a partial shape, could be combined to obtain an OLED with the overall desired light-emitting shape, but this approach is also less than satisfactory since the necessary encapsulation of each OLED element results in a clearly visible 'seam' between the separate elements.

Therefore, it is an object of the invention to provide a more economical way of obtaining an OLED device with separate light-emitting areas.

SUMMARY OF THE INVENTION

The object of the invention is achieved by the method of claim 1 and by the OLED device of claim 11.

The method according to the invention of providing spatially isolated light-emitting areas on a common substrate of an OLED device comprising a plurality of device layers, which device layers comprise an active layer enclosed between a first electrode and a second electrode, comprises the steps of applying an insulating bridge between a contact pad and the isolated region of the second electrode, and subsequently applying a conductor from the contact pad to the isolated region of the second electrode to form an electrical connection between the contact pad and the isolated region.

In this way, each spatially isolated region will be capable of emitting light once a voltage is applied across the anode and cathode of the OLED device. An obvious advantage of the invention is that the separate light emitting areas can have any desired shape or outline and are not subject to any restriction. Also, since an insulating bridge and conductor are used to connect a separate isolated second electrode region to a contact pad, a spatially isolated region of the second electrode can be located anywhere within the boundaries of the OLED device and does not need to be within direct reach of a cathode pad on the edge of the device.

The OLED device according to the invention, comprising a number of spatially isolated light-emitting areas on a common substrate (wherein the OLED device initially comprises an active layer enclosed between a first electrode layer and a second electrode layer), comprises at least one spatially and electrically isolated region of the second electrode, which isolated region is electrically isolated by selectively removed regions of the device layers around the isolated region of the second electrode; an insulating bridge applied between a contact pad and the isolated region of the second electrode; and a conductor applied onto the insulating bridge for electrically connecting the contact pad and the isolated region of the second electrode.

The dependent claims and the following description disclose particularly advantageous embodiments and features of the invention. Features of the embodiments may be combined as appropriate.

In the following, for the sake of simplicity, the first electrode may simply be referred to as the anode, and the second electrode may simply be referred to as the cathode, without restricting the invention in any way.

Current essentially flows from the anode to the cathode when the device is in operation. The shape of the light-emitting area(s) is governed by the second electrode, since the active layer can only conduct electricity when 'sandwiched' between the anode and the cathode, so that light will only be emitted in regions of the active layer under an intact second electrode region. Therefore, in a particularly preferred embodiment of the invention, the method comprises the step of selectively removing regions of the device layers to spatially and electrically isolate a region of the second electrode. The shapes or contours of the removed region of the second electrode will then determine the shapes of the remaining areas that can emit light.

The separate light emitting areas can be created by using shadow masks during deposition of the different layers. However, in a preferred method the spatially isolated regions are formed by selectively removing areas from a device, in which the layers have already all been deposited, in a post-deposition (or "post-depo") step. Therefore, the initial device layer stack can be manufactured in a straightforward manner by simply depositing the active and second electrode layers without the need for any specific patterning shadow masks.

In a preferred embodiment of the invention, the step of selectively removing material of the device layers to isolate specific regions of the second electrode comprises removing material of the second electrode. This ensures that current only flows from the anode through the active layer to those regions of the second electrode that remain after surrounding parts of the second electrode have been removed, while leaving the active layer intact so that the surface topology of the device remains relatively uniform.

However, removing only the second electrode in certain areas may be difficult since the second electrode is usually only a very thin layer. Therefore, in a further embodiment of the invention, the step of selectively removing material of the device layers comprises also removing material of the active layer in a region corresponding to the removed region of the second electrode. In this way, the post-depo ablation step can be greatly simplified, for example it is easier to configure a laser to remove a thicker layer than only a very thin layer.

There are different ways of removing material of the device layers. For example, the device layers can be removed to a certain depth by applying an appropriate milling technique. Device layers could also be etched away using a suitable etching process such as a plasma etching process. Alternatively, in a preferred embodiment of the invention, the material of the device layers is removed by directing a laser beam over the region to be removed to ablate material in that region. The depth of material removed can be controlled by driving the laser using appropriate laser parameters such as frequency, pulse duration, etc.

The insulating bridge, which ultimately extends between the contact pad and spatially isolated region, should serve to electrically insulate the device layers covered by the insulating bridge. Therefore, in a further preferred embodiment of the invention, the step of applying an insulating bridge between a contact pad and the isolated region of the second electrode comprises applying an electrically non-conductive layer onto exposed regions from which material has been removed. To reach a specific isolated region, the insulating bridge can also pass over or traverse other spatially isolated regions of the second electrode that lie between the cathode pad and the specific isolated region.

The insulating bridge can be applied using any suitable material and using any suitable technique. For example, the insulating bridge can be deposited or applied to generously cover the ablated areas. In such an approach, the insulating bridge can be deposited or even sprayed onto the areas to be covered. Alternatively, in a preferred embodiment, the insulating bridge can be applied as a narrower strip having a width of only up to a few millimeters. For example, a thin strip of non-conductive material could be glued to the device surface between the cathode pad and the isolated region. Alternatively, an electrically non-conductive material could be deposited using of a vapour deposition process using a suitable shadow mask. However, in a particularly preferred straightforward method, the step of applying an insulating bridge comprises printing an electrically non-conductive narrow strip between the contact pad and the isolated region of the second electrode. Printing techniques such as inkjet printing are particularly suitable for applying thin, precise layers of material in this manner.

After this preparatory step of applying the insulating bridge, the cathode pad and the specific isolated region can be electrically connected to each other. Therefore, in a preferred embodiment of the invention, an electrical conductor is applied between the cathode pad and the specific isolated region. Any suitable electrical conductor could be used. For example, a thin wire with favourable electrical conductive properties could be soldered to the cathode pad and to the isolated region, in such a way that the wire lies across the insulating bridge. The wire could also be glued to the insulating bridge. However, in a particularly preferred embodiment of the invention, the step of applying a conductor from the contact pad to the isolated region of the second electrode comprises printing a strip or line of electrically conductive material onto the insulating bridge. Again, any printing techniques such as inkjet printing could be used to print a thin electrically conductive strip onto the insulating bridge. In a preferred embodiment of the invention, the electrical conductor comprises a printed line of silver ink printed directly onto the insulating bridge. Preferably, the electrical conductor is as narrow as possible, and the width of the electrical conductor will depend on several factors such as the current to be transported, the conductivity of the material of the electrical conductor, etc. The width of an electrical conductor can be, for example, in the order of 100 µm-200 µm. Alternatively, instead of a single such 'wide' printed line between a contact pad and a particular isolated region, narrow lines each in the order of only a few tens of µm or less could be applied between the contact pad and the particular isolated region.

To ensure that the first electrode or any remaining parts of the active layer between the cathode pad and the isolated region are not touched by the electrical conductor, the electrical conductor preferably lies between the outer sides or edges of the insulating bridge. A 'border' of several hundred µm on either side of the electrical conductor can ensure that this is electrically isolated from the device layer under the insulating bridge. At either end of the insulating bridge, the electrical conductor should make contact to either the cathode pad or the isolated region. Therefore, in a further preferred embodiment of the invention, an electrical conductor is formed between the cathode pad and the isolated region by printing the electrically conductive strip to extend beyond an end of the insulating bridge onto the isolated region.

Depending on the type of ink being used, its adherence to the surface of the second electrode in the isolated region, or to the surface of the cathode pad, may require consideration. For example, if the wettability of the surface of the second electrode is such that the ink used does not satisfactorily adhere, an alternative approach may be used. Therefore, in another preferred embodiment of the invention, an electrical connection is formed between the conductor and the isolated region through an opening in the end of the insulating bridge. To this end, a small opening or through-hole may be made in one or both ends of the insulating bridge. The electrical conductor, applied over these openings or holes, can then make a satisfactory electrical connection between the cathode pad and the isolated region.

An electrically conductive ink or metal paste of the type mentioned above, for printing or dispensing, comprises small particles or globules of metal usually encapsulated in a polymer shell and suspended in a suitable solvent. In order to improve the electrical conductivity of the printed electrical conductor, the method according to the invention preferably comprises a step of annealing the printed conductor. During annealing, the metal paste is effectively 'baked' at a high temperature so that the encapsulation melts or dissolves to some extent, allowing any solvent to evaporate and causing the metal globules to join together forming a conductive 'network'. This also improves the contact between the printed line and the underlying material, in this case the insulating bridge, the surface of the cathode pad, and the surface of the isolated region. The temperature necessary for a successful annealing process depends on the metal paste used. However, a high temperature may be detrimental to the functionality of the active layer. In conventional annealing processes, the annealing step is usually carried out in an oven, and the entire OLED device is exposed to the high temperatures. However, when using silver nano-inks or silver metal precursor inks for printing an electrically conductive line, a favourably low temperature of 130° C. or even 90° C. can be sufficient to anneal the printed line. Heat treatment of OLEDs between 90° C. and 130° C. for brief periods are possible without affecting the device performance.

To allow successful annealing at higher temperatures without damaging the OLED device (for example when using a different metal paste), the step of annealing the electrical conductor can comprises a local deposition of energy in the material of the electrical conductor, so that effectively only the electrical conductor is heated and the remainder of the OLED is not directly exposed to heat. Any suitable source of thermal energy can be used, for example a UV or IR light source. In a preferred embodiment, however, the annealing step comprises directing a laser light beam at the electrical conductor to heat essentially only the material of that electrical conductor. The laser parameters can be chosen such that the laser light energy is absorbed essentially only in the electrical conductor. In this way, the heat exposure is limited to the area in the immediate vicinity of the electrical conductor.

As already indicated above, the method according to the invention allows the realisation of separate light-emitting regions of any shape or design. Therefore, in a preferred embodiment of the OLED device according to the invention, a plurality of spatially isolated regions of the second electrode is arranged such that a first spatially isolated region is surrounded by a second spatially isolated region. In other words, separate nested regions, for example separate concentric regions, can be realised. This can be very desirable in applications such as exit signs, emergency signs or company logos composed of symbols or letters.

OLEDs can be realised to be bottom-emitting (i.e. the OLED emits through the substrate, which is then usually a transparent glass or plastic layer) or top-emitting (in which case the second electrode is transparent). In the case of a bottom-emitting OLED, the choice of material for the insulating bridges and the electrical conductors is not subject to any transparency restriction. However, in some lighting applications the OLED should be transparent when turned off. Therefore, in a further preferred embodiment of the OLED according to the invention, the substrate, first electrode, active layer and second electrode are realised using transparent materials, and the insulating bridge also comprises a transparent material such as clear photo-resist. For a transparent OLED, the insulating bridge can be applied as a layer essentially covering the entire OLED area. In this way, there are no edges that might otherwise be visible, even faintly, when the OLED is turned off. Effectively, in this approach, only one insulating 'bridge' is required, and the electrical connections between the contact pads and any isolated regions can be applied onto this insulating layer (with through-holes as appropriate for accessing the surface of the second electrode on each isolated region). To ensure that the conductor between the contact pad and an isolated region is also as invisible as possible for a transparent OLED, the conductor may be applied as a group of narrow lines, whereby each line forms an electrical connection between the contact pad and the isolated region. When the electrical conductor is applied by printing a silver ink as described above, the conductivity of a very thin (and therefore essentially invisible) printed line may be sufficient. Evidently, if a wider electrical conductor should be desired, a transparent material could be used for the electrical conductor. For example, an ITO or zinc oxide could be used for the conductor, and the electrically conducting lines can be applied in the known manner in a vacuum chamber.

BRIEF DESCRIPTION OF THE DRAWINGS

In the drawings, like numbers refer to like objects throughout. Objects in the diagrams are not necessarily drawn to scale, in particular the layer thicknesses of the OLED device layers and the relative dimensions of the OLED device elements are not drawn to scale.

DETAILED DESCRIPTION OF THE EMBODIMENTS

Figure 1:
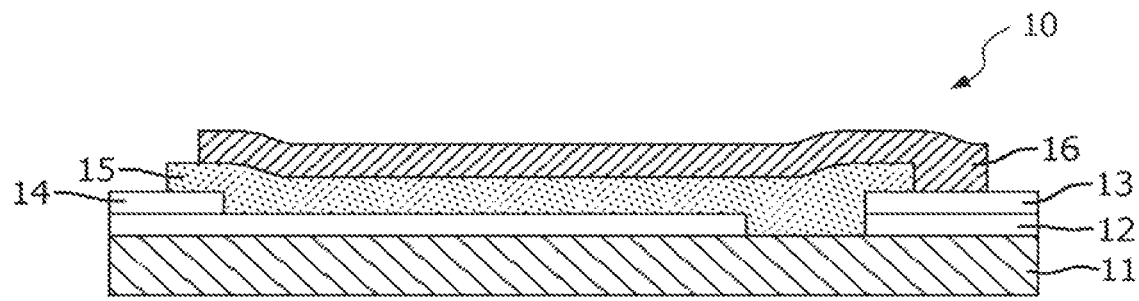
FIG. 1 shows a cross-section through an OLED device manufactured using a known technique.

FIG. 1 shows a cross-section through an OLED device 10 manufactured using a known technique. Here, a first electrode layer 12 is applied to a glass or plastic substrate 11. The material of the first electrode 12 is structured so that separate regions 12 are deposited on the substrate 11. At the outside edges, cathode contact pads 13 and anode contact pads 14 are deposited. In a subsequent step, an active layer 15 (one or more layers of organic material) is applied, usually in a vapour deposition process. Then, a cathode layer 16 is deposited on top of the active layer 15 such that it at least partially covers a cathode contact pad 13. The device 10 is encapsulated in a final step (not shown) to leave the anode and cathode contact pads 13, 14 exposed while sealing the device layers to protect them from moisture. To cause the device 10 to emit light, a voltage is applied across a cathode contact pad 13 and an anode contact pad 14, allowing current to flow through the active layer 15 and causing this to emit light. Light can be emitted through the substrate 11 and/or through the cathode 16, depending on whether one or both of these are made of a transparent material. In either case, the entire active layer 15 is stimulated when a voltage is applied across the anode 12 and cathode 16, so that the entire active layer emits light. The relative thicknesses of the device layer s are not shown to scale. Typically, an electrode layer 12, 16 may have a thickness in the order of 80 nm to 300 nm, while the active layer can have a thickness from 80 nm to 500 nm.

Figure 2:
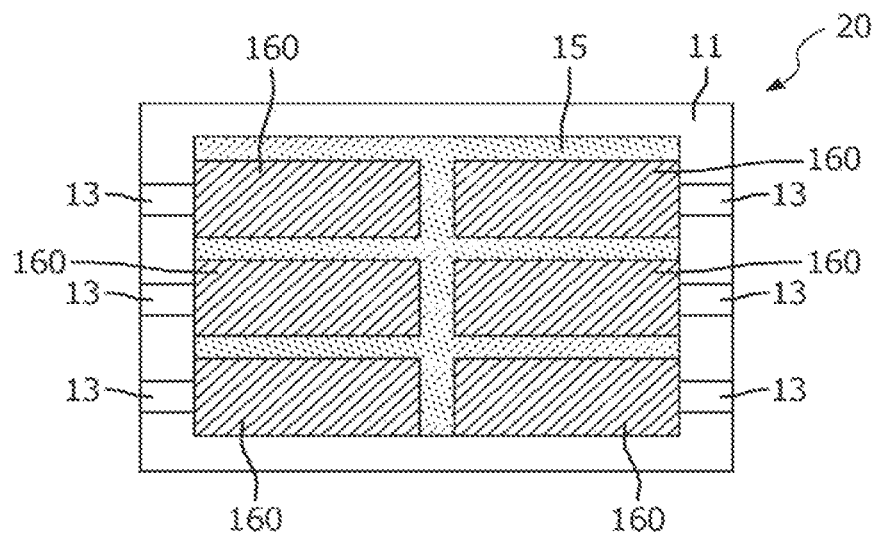
FIG. 2 shows a plan view of a prior art OLED with a structured cathode layer.

FIG. 2 shows a plan view of a prior art OLED 20 with a cathode layer structured in order to allow separate light emitting areas 160. To this end, the cathode layer has been deposited using a shadow mask with suitably shaped openings such that cathode material is deposited only in areas 160 which are spatially separate from each other. To allow the device 20 to emit light in these areas 160, each of these areas 160 must be in electrical contact to a cathode pad 13 at the side of the OLED device 20. This places considerable restrictions on the realisation of separate light-emitting areas, since each must be connected in some way to the cathode pads 13. Furthermore, use of a shadow mask in a vapour deposition step adds to the overall expense of a device. Also, the known limitations of a shadow mask mean that the separate cathode areas 160 can only be realised to have regular geometric shapes. The dimensions of a prior art OLED manufactured in this way are limited to devices of about 5 cm×5 cm.

Figure 3:
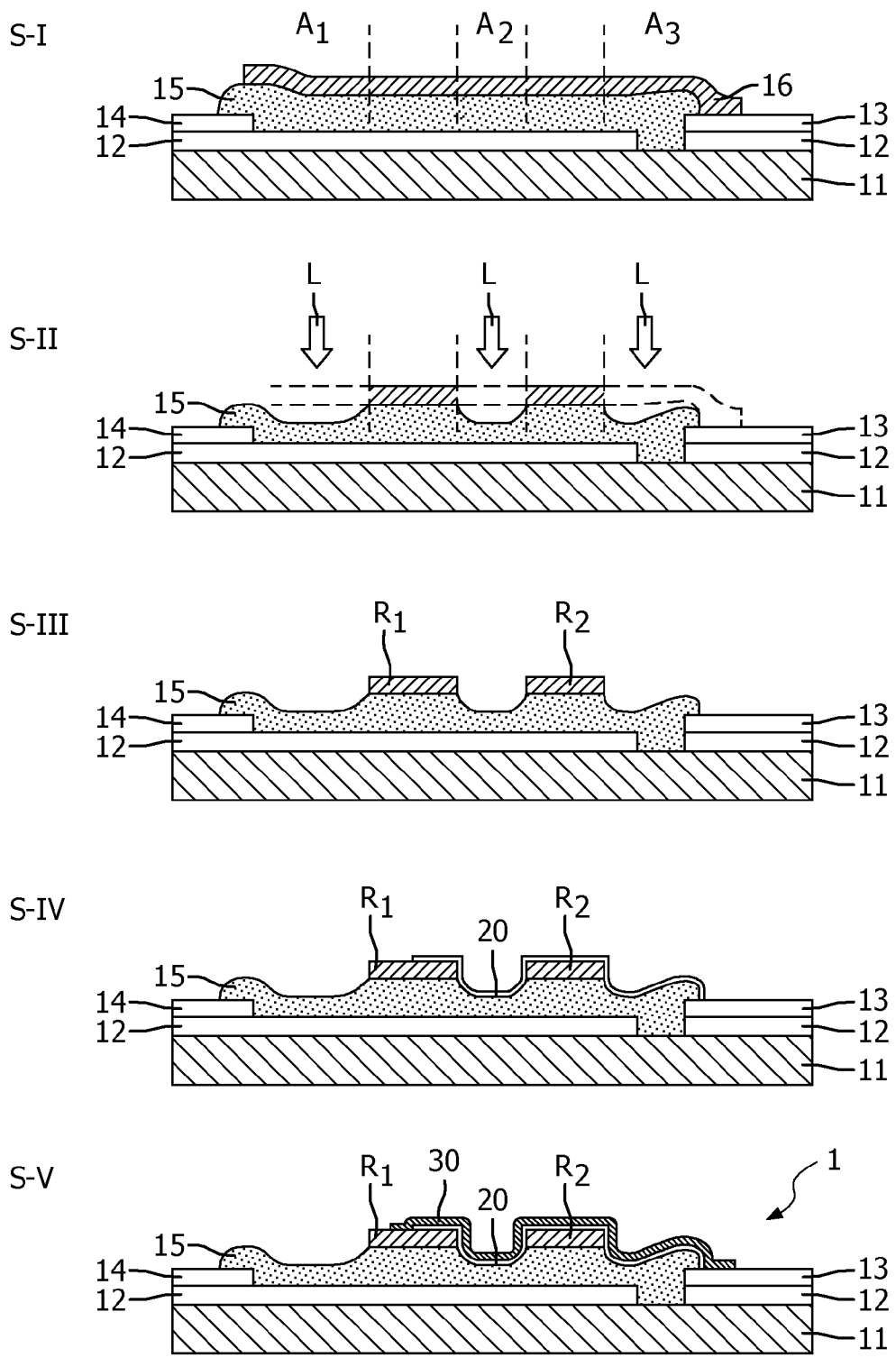
FIG. 3 illustrates the steps of the method according to the invention of manufacturing an OLED device with isolated light-emitting regions.

FIG. 3 illustrates the steps of the method, according to the invention, of manufacturing an OLED device 1 with isolated light-emitting regions. Initially, an OLED device of the type described in FIG. 1 is used as a basis, having a substrate 11, a first electrode 12 (for example the anode 12), an active layer 15, a second electrode 16 (for example the cathode 16) and contact pads 13, 14. Regions $A_1, A_2, A_3$ to be ablated in a post-depo ablation process are marked in a first stage S-I, as indicated by the vertical broken lines. In a following stage S-II, a beam of laser light L is directed at each of the regions $A_1, A_2, A_3$ to be ablated, and the material in these regions $A_1, A_2, A_3$ is removed, as indicated by the horizontal dotted lines indicating the original layer thicknesses. For example, material of the second electrode layer and the underlying active layer 15 may be vaporised. The depth of ablation in the underlying active layer 15 can depend on the manner in which the laser is driven. After the ablation, in stage S-III, spatially and electrically isolated first and second regions $R_1, R_2$ have been formed that are spatially separate from each other and that have no electrical contact to a contact pad 13 at the edge of the device 1. It now remains to connect the isolated regions to a contact pad of the device. Stage S-IV shows how an insulating bridge 20 is applied between a contact pad 13 at the edge of the device 1 and the first isolated region $R_1$, crossing or traversing the other isolated region $R_2$ as well as the exposed active layer between the two isolated regions $R_1, R_2$. In a fifth stage S-V, an electrical conductor 30 is applied, for example by printing using an inkjet printing process, to make an electrical connection 30 between the contact pad 13 at the edge of the device 1 and the first isolated region $R_1$. Evidently, although not shown in the diagram, a similar insulating bridge 20 and conductor 30 can be applied to connect the second isolated regions $R_2$ to a contact pad at the edge of the device 1.

Figure 4:
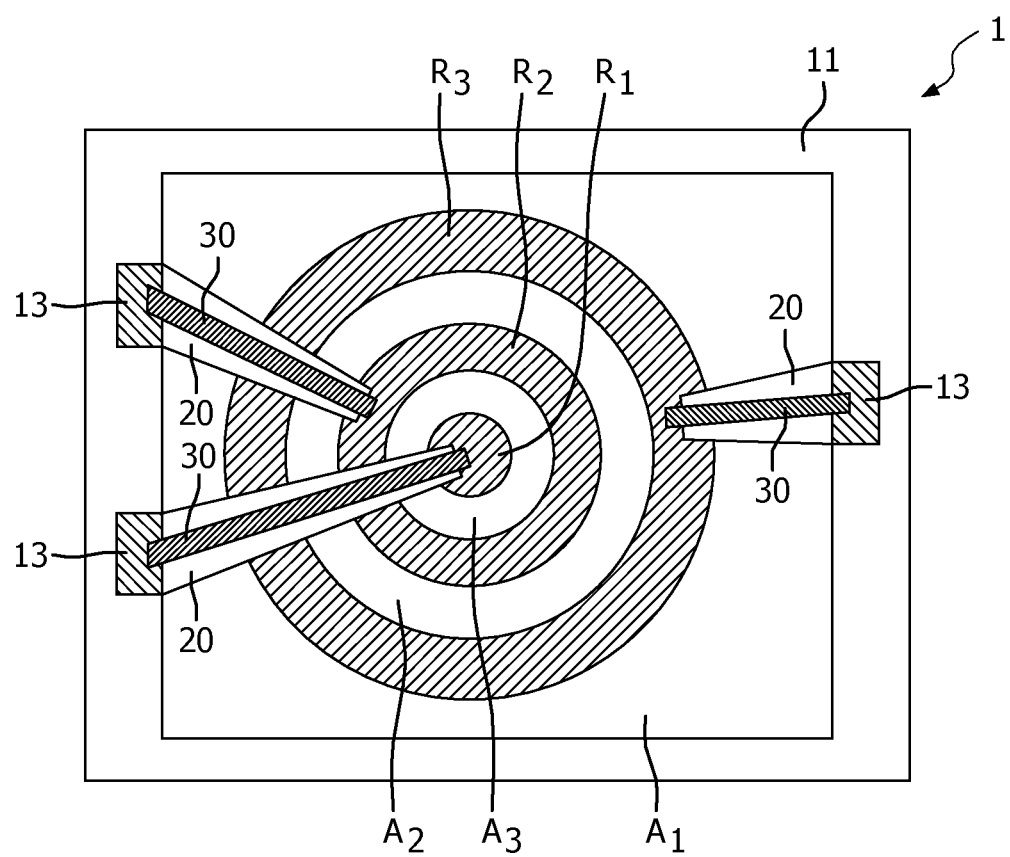
FIG. 4 shows an embodiment of an OLED device according to the invention manufactured using the steps described in FIG. 3.

FIG. 4 shows a plan view of a device 1 that has been manufactured using the steps described in FIG. 3 above. Here, it can be seen that three spatially and electrically isolated regions $R_1, R_2, R_3$ have been formed by ablating other 'unwanted' areas $A_1, A_2, A_3$ of the second electrode layer and active layer in a post-depo ablation procedure. Depending on how much material was removed, the ablated areas $A_1, A_2, A_3$ may expose the active layer and/or the first electrode layer. In this example, the isolated regions $R_1, R_2, R_3$ are shown to be in the form of concentric circles $R_1, R_2, R_3$, but it will be clear that any shape or contour is possible. So that each of these isolated regions $R_1, R_2, R_3$ can also emit light, each is connected to a contact pad 13 at the edge of the device 1 by means of an electrical conductor 30 printed on top of an insulating bridge 20 between that region $R_1, R_2, R_3$ and a corresponding contact pad 13. When a voltage is applied across the contact pads of the cathode and anode (not shown in the diagram), an electrical current can flow through the active layer underneath each of the isolated regions $R_1, R_2, R_3$, causing these to emit light. No other part of the device will emit light. In the diagram, the relative widths of the insulating bridges 20 and the electrical conductors 20 are shown to be much wider than they would be in an actual realisation of the device 1. Furthermore, if the OLED device is realised as a bottom emitting device, i.e. it emits through the substrate 11, the insulating bridges 20 and electric conductors 30 will in any case not be visible. Using this technique, interesting patterns for light-emitting areas can be realised for large-scale OLED displays, for example, for decorative illumination applications.

Figure 5:
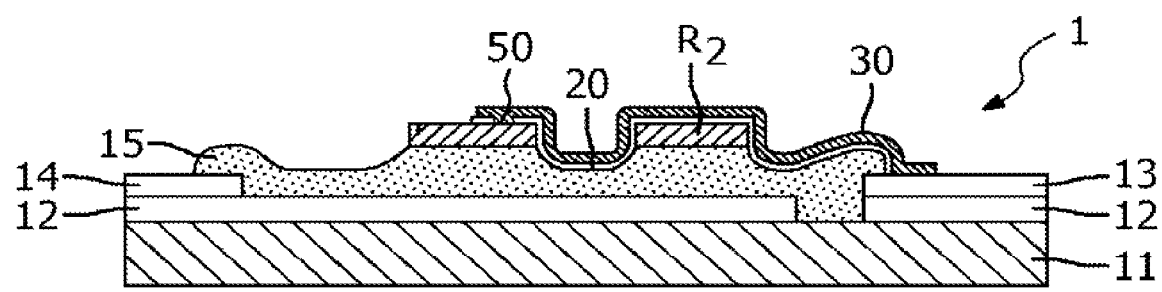
FIG. 5 shows a cross-section through an OLED device where a conductor contacts through a hole in an insulating bridge.

Referring now to FIG. 5, an alternative embodiment is shown wherein the electrical connection 30 does not extend past the insulating bridge 20. Instead, the conductor contacts the cathode 16 through an opening 50 in the end of the insulating bridge 20.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method of providing spatially isolated light-emitting regions on a common substrate of an OLED device that comprises a plurality of device layers including an active layer enclosed between a first electrode and a second electrode, said method comprising:
    selectively removing material from at least one region of the device layers to spatially and electrically isolate a region of the second electrode, wherein a first spatially isolated region is surrounded by a second spatially isolated region;
    applying an insulating bridge between a contact pad and the first spatially isolated region of the second electrode;
    and subsequently applying a conductor from the contact pad to the first spatially isolated region of the second electrode to form an electrical connection between the contact pad and the first spatially isolated region.

2. A method according to claim 1, wherein the step of selectively removing material of the device layers comprises removing material of the second electrode.

3. A method according to claim 1, wherein the step of selectively removing material of the device layers comprises partially removing material of the active layer in a region corresponding to the removed material of the second electrode, leaving a remaining layer of material in the active layer.

4. A method according to claim 1, wherein the material of the device layers is removed by directing a laser beam over the region to be removed to ablate material in that region.

5. A method according to claim 1, wherein the step of applying an insulating bridge between the contact pad and the first spatially isolated region of the second electrode comprises applying an electrically non-conductive layer to traverse exposed regions from which device layer material has been removed.

6. A method according to claim 1, wherein the step of applying an insulating bridge comprises printing an electrically non-conductive strip between the contact pad and the first spatially isolated region of the second electrode.

7. The method of claim 6, wherein the non-conductive strip has a width about ten times greater than a width of the conductor.

8. A method according to claim 1, wherein the step of applying a conductor from the contact pad to the first spatially isolated region of the second electrode comprises printing an electrically conductive strip onto the insulating bridge.

9. A method according to claim 1, wherein an electrical connection is formed between the conductor and the first spatially isolated region by printing an electrically conductive strip to extend beyond an end of the insulating bridge onto the first spatially isolated region.

10. A method according to claim 1, wherein the electrical connection is formed between the conductor and the first spatially isolated region through an opening in the end of the insulating bridge.

11. The method of claim 10, wherein the insulating bridge has only a single opening.

12. A method according any to claim 1, comprising a step of laser annealing the electrical conductor.

13. An OLED device, comprising:
    a plurality of spatially isolated light-emitting regions on a common substrate, wherein a first spatially isolated region is surrounded by a second spatially isolated region;

a plurality of device layers of the OLED device comprising an active layer enclosed between a first electrode and a second electrode;

a plurality of spatially and electrically isolated regions of the second electrode corresponding to respective spatially isolated light-emitting regions;

an insulating bridge applied between a contact pad and the first spatially isolated region of the second electrode; and a conductor applied onto the insulating bridge for electrically connecting the contact pad and the first spatially isolated region of the second electrode.

14. An OLED device according to claim 13, wherein the conductor comprises a printed line of silver ink printed onto the insulating bridge.

15. An OLED device according to claim 13, wherein the insulating bridge and the conductor comprises a transparent material.

\* \* \* \* \*